US005378580A

United States Patent [19]

Leenders

[11] Patent Number: 5,378,580

[45] Date of Patent: Jan. 3, 1995

[54] HEAT MODE RECORDING MATERIAL AND METHOD FOR PRODUCING DRIOGRAPHIC PRINTING PLATES

[75] Inventor: Luc Leenders, Herentals, Belgium

[73] Assignee: AGFA-Gevaert, N.V., Mortsel, Belgium

[21] Appl. No.: 59,283

[22] Filed: May 11, 1993

[30] Foreign Application Priority Data

Jun. 5, 1992 [XH] Hague Agreement ............ 92201633

[51] Int. Cl.[6] ............................ G03F 7/30; G03F 7/36

[52] U.S. Cl. .................................... 430/303; 430/326; 430/330; 430/272; 430/273; 430/944; 430/945; 101/467

[58] Field of Search ............... 430/303, 945, 944, 964, 430/326, 330, 346, 348, 272, 273, 198; 101/467, 453, 465, 463.1

[56] References Cited

U.S. PATENT DOCUMENTS 4,842,988 6/1989 Herrmann et al. .................. 430/303
4,842,990 6/1989 Herrmann et al. .................. 430/303
5,053,311 10/1991 Makino et al. ...................... 430/303

FOREIGN PATENT DOCUMENTS 56-13168 2/1981 Japan .................................. 101/467

*Primary Examiner*—Janis L. Dote
*Attorney, Agent, or Firm*—Breiner & Breiner

[57] ABSTRACT

The present invention provides a method for making a lithographic printing plate requiring no dampening liquid comprising the steps of:

image-wise exposing using a laser beam a heat mode recording material comprising on a support having an oleophilic surface (i) a recording layer having a thickness of not more than 3 μm and containing a substance capable of converting the laser beam radiation into heat and (ii) a cured oleophobic surface layer and wherein said recording layer and oleophobic surface layer may be the same layer;

rubbing the exposed heat mode recording material thereby removing said oleophobic surface layer in the exposed areas so that the underlying oleophilic surface is exposed and avoiding the swelling of said oleophobic surface layer by carrying out said rubbing without the use of a liquid or with the use of a non-solvent for said oleophobic surface layer.

5 Claims, No Drawings

HEAT MODE RECORDING MATERIAL AND METHOD FOR PRODUCING DRIOGRAPHIC PRINTING PLATES

DESCRIPTION

1. Field of the Invention

The present invention relates to a heat mode recording material for making a lithographic printing plate for use in lithographic printing without dampening. The present invention further relates to a method for imaging said heat mode recording material by means of a laser.

2. Background of the invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plates comprise highly ink repellant areas and oleophilic areas. Generally the highly ink repellant areas are formed by a silicon layer.

Driographic printing plates can be prepared using a photographic material that is made image-wise receptive or repellant to ink upon photo-exposure of the photographic material. However heat mode recording materials, the surface of which can be made image-wise receptive or repellant to ink upon image-wise exposure to heat and/or subsequent development are also known for preparing driographic printing plates.

For example in DE-A-2512038 there is disclosed a heat mode recording material that comprises on a support carrying or having an oleophilic surface (i) a heat mode recording layer containing a self oxidizing binder e.g. nitrocellulose and a substance that is capable of converting radiation into heat e.g. carbon black and (ii) a non-hardened silicon layer as a surface layer. The disclosed heat mode recording material is image-wise exposed using a laser and is subsequently developed using a developing liquid that is capable of dissolving the silicon layer in the exposed areas. Subsequent to this development the silicon surface layer is cured. Due to the use of naphta as a developing liquid the process is ecologically disadvantageous. Further since the surface layer is not hardened the heat mode recording material may be easily damaged during handling.

FR-A-1.473.751 discloses a heat mode recording material comprising a substrate having an oleophilic surface a layer containing nitrocellulose and carbon black and a silicon layer. After image-wise exposure using a laser the imaged areas are said to be rendered oleophilic. The decomposed silicon layer is not removed. Ink acceptance of the obtained plates is poor and the printing properties such as printing endurance and resolution of the copies is rather poor.

Research Disclosure 19201 of April 1980 discloses a heat mode recording material comprising a polyester film support provided with a bismuth layer as a heat mode recording layer and a silicon layer on top thereof. The disclosed heat mode recording material is imaged using an Argon laser and developed using hexane.

From the above it can be seen that a number of proposals have been made for making a driographic printing plate using a heat mode recording material. They have disadvantages such as the need for development with ecologically disadvantageous solvents and/or the obtained plates are of poor quality.

3. Summary of the Invention

According to the present invention it is an object to provide an alternative heat mode recording material for making a driographic printing plate of high quality and that preferably can be obtained without the need of solvent development or that can be obtained with ecologically more acceptable solvents.

It is a further object of the present invention to provide a method for obtaining a driographic printing plate of high quality using a heat mode recording material and wherein the need of a solvent is avoided or wherein ecollogically more acceptable solvents can be used for developing the heat mode recording material.

Further objects of the present invention will become clear from the description hereinafter.

According to the present invention there is provided a method for making a lithographic printing plate requiring no dampening liquid comprising the steps of:

image-wise exposing using a laser beam a heat mode recording material comprising on a support having an oleophilic surface or an oleophilic layer thereon (i) a recording layer having a thickness of not more than 3 $\mu m$ and containing a light-to-heat converting substance capable of converting the laser beam radiation into heat and (ii) a cured oleophobic surface layer and wherein said recording layer and surface layer may be the same layer rubbing the exposed heat mode recording material thereby removing said oleophobic surface layer in the exposed areas so that the underlying oleophilic surface is exposed and avoiding the swelling of said oleophobic surface layer by carrying out said rubbing without the use of a liquid or with the use of a non-solvent for said oleophobic surface layer.

According to the present invention there is also provided a heat mode recording material comprising on a support having an oleophilic surface (i) a recording layer having a thickness of not more than 3 $\mu m$ and containing a light-to-heat converting substance capable of converting radiation into heat and (ii) a cured oleophobic surface layer and wherein said oleophobic surface layer and recording layer may be the same layer.

4. Detailed Description of the Invention

It has been found that with the above described method of the present invention driographic printing plates can be obtained yielding a high printing endurance, high sharpness, good contrast and an excellent resolution in an ecologically more acceptable way.

According to the method of the present invention the heat mode recording material is image-wise exposed using a laser. Preferably used lasers are e.g. semiconductor lasers, YAG lasers e.g. Nd-YAG lasers, Argon lasers etc. The laser may have a power output between 40 and 7500 mW and preferably operates in the infrared part of the spectrum. Preferably the support of the heat mode recording material is transparant and image-wise exposure proceeds through the support.

Subsequent to the image-wise exposure the oleophobic surface layer is rubbed. Rubbing can be done using e.g. a brush or a cotton pad. Rubbing of the heat mode recording material is preferably carried out in absence of a liquid however a non-solvent for the oleophobic surface layer may be used such a e.g. isopropanol when the surface layer contains a polysiloxane. Rubbing according to the present invention offers in addition to the ecological advantage printing plates of high resolution and sharpness.

According to a preferred embodiment of the present invention the heat mode recording material contains a separate heat mode recording layer containing the heat converting substance comprised between the support and the oleophobic surface layer. Examples of substances capable of converting radiation into heat are e.g. carbon black, infrared or near infrared absorbing dyes or pigments, metals such as Bi, Sn, Te etc. or a combination thereof. Suitable infrared dyes are disclosed in e.g. U.S. Pat. No. 4,833,124, EP-321923, U.S. Pat. No. 4,772,583, U.S. Pat. No. 4,942,141, U.S. Pat. No. 4,948,776, U.S. Pat. No. 4,948,777, U.S. Pat. No. 4,948,778. U.S. Pat. No. 4,950,639, U.S. Pat. No. 4,950,640, U.S. Pat. No. 4,912,083, U.S. Pat. No. 4,952,552, U.S. Pat. No. 5,024,990, U.S. Pat. No. 5,023,229 etc.. Suitable infrared pigments are e.g. HEUCODOR metal oxide pigments available from Heubach Langelsheim. When a metal such as e.g. bismuth is used as a heat converting substance the recording layer is preferably a vacuum deposited metal layer.

According to the present invention the thickness of the recording layer may not be more than 3 μm in order to obtain a printing plate of acceptable quality, more preferably the thickness will be less than 2.5 μm. Typically the recording layer preferably has a thickness between 150 Å and 1.5 μm. The maximum thickness of 3 μm of the recording layer is especially important when exposure is carried out through the support.

According to a particular embodiment of the present invention the recording layer may be a vacuum deposited aluminium layer. The thickness of such and aluminium layer however should be less than 250 Å and more preferably between 100 Å and 225 Å. When the thickness of the aluminium recording layer becomes too large the heat mode recording material in connection with the present invention cannot be imaged.

The heat mode recording layer used in connection with the present invention may contain a binder e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth)acrylates, polyvinyl chloride, silicone resin etc.. The recording layer may further contain other ingredients such as e.g. wetting agents, matting agents, anti-oxidizing agents etc.. Preferably the heat mode recording layer contains a polymer containing covalently bound chlorine. Alternatively part or all of this polymer may be contained in a separate layer located adjacent to the heat mode recording layer and most preferably between the support and the heat mode recording layer. The heat mode recording layer in connection with the present invention may be hardened. For example a nitrocellulose layer hardened with an isocyanate may be used.

It has been found that when a polymer containing covalently bound chlorine is contained in the heat mode recording layer of a recording material or in an adjacent layer the speed of the recording material can be improved.

Suitable chlorine containing polymers for use in accordance with the present invention are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol, chlorinated polyethylene, polychloroprene and copolymers therof, chlorosulfonated polyethylene, polychlorotrifluoroethylene, polymethyl-alpha-chloroacrylate etc.

The chlorine containing polymer used in connection with the present invention may be prepared by various polymerization methods of the constituting monomers. For example, the polymerization may be conducted in aqueous dispersion containing a catalyst and activator, e.g., sodium persulphate and meta sodium bisulphite, and an emulsifying and/or dispersing agent. Alternatively, the homopolymers or copolymers used with the present invention may be prepared by polymerization of the monomeric components in the bulk without added diluent, or the monomers may be reacted in appropriate organic solvent reaction media. The total catalyst-activator concentration should generally be kept within a range of about 0.01% to about 2.0% by weight of the monomer charge, and preferably within a range of concentration of 0.1% to 1.0%. Improved solubility and viscosity values are obtained by conducting the polymerization in the presence of mercaptans such as ethyl mercaptan, lauryl mercaptan, tertiary dodecyl mercaptan, etc., which are effective in reducing cross-linking in the copolymer. In general, the mercaptans should be used in concentrations of 0.1% to 5.0% by weight, based on the weight of polymerizable monomers present in the charge.

Alternatively the chlorine containing polymer may be prepared by chloronating homopolymers or copolymers. For example chlorinated rubbers such as polychloroprene may be prepared by reacting a rubber with chlorine gas. In a similar manner chlorinated polyethylene may be prepared.

According to an alternative embodiment the heat converting substance may be contained in the oleophobic surface layer provided that said substance is homogeneously distributed therein.

Suitable supports for the heat mode recording material used in connection with present invention are preferably non-metallic supports having an oleophilic surface e.g. a polyester film support, paper coated with a polyolefin such as polyethylene, polycarbonate film, polystyrene film etc.. However metallic support such as e.g. aluminium can also be used in connection with the present invention. In case the surface of the support is not or insufficiently oleophilic it may be provided with an oleophilic layer.

The oleophobic surface layer in accordance with the present invention preferably has a thickness of at least 1.0 μm and more preferably at least 1.5 μm. The maximum thickness of the surface layer is not critical but will preferably be not more than 5 μm and more preferably not more than 4 μm. It has been found that the thickness of the oleophobic surface layer influences the printing endurance, sharpness and resolution of the printing plate.

According to the present invention the oleophobic surface layer preferably contains a hardened silicone coating. Preferably the silicone coating contains one or more components one of which is generally a linear silicone polymer terminated with a chemically reactive group at both ends and a multifunctional component as a hardening agent. The silicone coating can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si—H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multi functional (meth)acrylate monomers.

According to the present invention the ink repellant layer may comprise additional substances such as e.g. plasticities, pigments, dyes etc..

The present invention will now be illustrated with the following examples without however limiting it thereto. All parts are by weight unless otherwise specified.

EXAMPLE 1

The following coating solution for the ink repellant layer was prepared:

| | |
|---|---|
| EXXSOL DSP 80/110[1] (Exxon Chemicals) | 379.5 g |
| vinyl terminated dimethylpolysiloxane | 95 g |
| SYL-OFF 7367[2] (Dow Corning) | 4 g |
| divinyltetramethyl disiloxane complex of platinum (containing 1.5% of xylene) | 0.56 g |

[1]Exxsol DSP 80/110 is a naphta i.e. a mixture of paraffins and in which the content of aromatics has been reduced.
[2]Syl-off 7367 is the cross-linker used and is a solution of 71% of methyl hydrogen polysiloxane in ethynylcyclohexene.

The following coating solution for the recording layer was prepared:

10 ml of a methyl ethylketone solution containing 10% of Carbon black (Mitsubishi #30), 1% of Solsperse 24000 (obtained from ICI) wetting agent and 0.5% of Solsperse 5000 (obtained from ICI) wetting agent;

12.5 ml of a methoxypropanol/methanol (30/70) solution containing 8% of nitrocellulose and 1% of a polysiloxane surfactant (Dow Corning 190 from Dow Chemicals).

A comparitive heat mode recording material was prepared by coating the above coating solution for the recording layer to a polyethylene terephthalate film support (175 μm) with a Braive coating knife (50 μm) to a dry layer thickness of 4.5 μm.

To this layer was coated the ink repellant layer from the above described coating solution to a dry thickness of 2.5 μm. Subsequent the ink repellant layer was cured for 5 min. at 130° C.

A heat mode recording material according to the invention was prepared similar to the comparative sample with the exception that the coating solution for the recording layer further contained 17.5 ml of methyl ethylketone and that said recording layer was applied to a dry thickness of 1 μm.

Both samples were image-wise exposed through the support using a Nd-Yag laser (1064 nm) at a linear writing speed of 14 m/s, with a spot diameter of 6.5 μm ($1/e^2$) and a power output of 212 mW for the comparative sample and 160 mW for the invention sample. Both heat mode recording materials were then rubbed with a dry cotton pad to remove the ink repellant layer in the exposed parts.

Both samples were subsequently used to print on a printing press without dampening and the resolution of on the plate was measured after the first 100 copies. It was found that the comparitive sample could reproduce a line having a width of 26.4 μm while the invention sample could reproduce 6.6 μm lines.

EXAMPLE 2

To a polyethylene terephthalate support provided with a layer of a copolymer of vinylidenechloride (88 mol %), methylacrylate (10 mol %) and itaconic acid (2 mol %) in an amount of 170 mg/m² was vacuum deposited a bismuth layer as a recording layer such that the optical density thereof was 1.7 (thickness of about 0.11 μm). To this recording layer was then coated the ink repellant layer described in example 1 to a dry thickness of 1 μm and which was cured as described in example 1.

3 thus prepared heat mode recording materials were image-wise exposed through the support with a Nd-Yag laser as described in example 1 with exception that the power output was 200 mW. After image-wise exposure one of the heat recording materials was rubbed with a cotton pad soaked with isopropanol (A), another was rubbed with a dry cotton pad (B) and a third was not rubbed at all (C). Each of the 3 obtained plates was used to print on a printing press without dampening and the resolution of the plates was measured after 5 and 50 copies.

The following results were obtained:

| printing plate | resolution* after 5 copies | resolution* after 50 copies |
|---|---|---|
| A | 9.9 μm | 6.6 μm |
| B | 26.4 μm | 16.5 μm |
| C | no image was obtained | |

*resolution is expressed as the smallest line that is completely reproduced on the copy.

I claim:

1. Method for making a lithographic printing plate requiring no dampening liquid comprising the steps of:

image-wise exposing using a laser beam a heat mode recording material comprising on a support having an oleophilic surface (i) a recording layer having a thickness of not more than 3 μm and containing a substance capable of converting the laser beam radiation into heat and (ii) a cured oleophobic surface layer containing a polysiloxane and wherein said recording layer and oleophobic surface layer may be the same layer;

rubbing the exposed heat mode recording material thereby removing said oleophobic surface layer in the exposed areas so that the underlying oleophilic surface is exposed and avoiding the swelling of said oleophobic surface layer by carrying out said rubbing without the use of a liquid or with the use of isopropanol as a non-solvent for said oleophobic surface layer.

2. A method according to claim 1 wherein said substance capable of converting the laser beam radiation into heat is included in a recording layer provided between said support and said oleophobic surface layer, 3. A method according to claim 2 wherein said recording layer has a thickness of not more than 2.5 μm.

4. A method according to claim 1 wherein said substance capable of converting the laser beam radiation into heat is carbon black, an infrared absorbing dye, an infrared absorbing pigment or bismuth.

5. A method according to claim 1 wherein said support is transparent and image-wise exposure is carried out through said support.

* * * * *